US012597439B2

(12) United States Patent (10) Patent No.: US 12,597,439 B2
Kishimoto et al. (45) Date of Patent: Apr. 7, 2026

(54) FLEXIBLE PRINTED CIRCUIT FINGER TRACE LAYOUT FOR PARALLEL SERVO OPERATION

(71) Applicant: Western Digital Technologies, Inc., San Jose, CA (US)

(72) Inventors: Masahiro Kishimoto, Fujisawa (JP); Teruhiro Nakamiya, Setagaya (JP); Satoshi Nakamura, Yokohama (JP); John Contreras, Palo Alto, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/646,582

(22) Filed: Apr. 25, 2024

(65) Prior Publication Data

US 2025/0336416 A1 Oct. 30, 2025

(51) Int. Cl.
G11B 5/48 (2006.01)
H05K 1/02 (2006.01)
(52) U.S. Cl.
CPC ........... G11B 5/486 (2013.01); H05K 1/0296 (2013.01)
(58) Field of Classification Search
None
See application file for complete search history.

(56) References Cited

U.S. PATENT DOCUMENTS 5,754,369 A * 5/1998 Balakrishnan ....... G11B 5/4853
360/264.2
9,064,513 B1 * 6/2015 Pan ........................ G11B 5/486

9,218,822 B1 12/2015 Contreras et al.
9,361,919 B1 6/2016 Lieu et al.
9,489,971 B1 11/2016 Klarqvist et al.
10,482,910 B2 * 11/2019 Yoshikawa .......... G11B 5/4846
2002/0154436 A1 * 10/2002 Goodman ............ G11B 5/4846
2004/0109253 A1 * 6/2004 Nishiyama ......... G11B 5/59605
2004/0165305 A1 * 8/2004 Nishiyama ........... G11B 5/5552
(Continued)

FOREIGN PATENT DOCUMENTS

WO WO2016053195 A1 4/2016

OTHER PUBLICATIONS

Israel Patent Office (ISA/IL), PCT International Search Report and Written Opinion for counterpart International application No. PCT/ US2025/011513, May 8, 2025, 7 pages.

*Primary Examiner* — William J Klimowicz
(74) *Attorney, Agent, or Firm* — John D. Henkhaus

(57) ABSTRACT

A flexible printed circuit (FPC) for a hard disk drive includes a first preamplifier electrically connected to first read-write transducers and a second preamplifier electrically connected to second read-write transducers, where all transducers are driven via a single primary actuator, with a top FPC section including electrical traces between a fine actuator corresponding to one of the first transducers and a corresponding controller and a bottom FPC section including traces between a fine actuator corresponding to one of the second transducers and a corresponding controller. To inhibit potential crosstalk between the fine actuator traces and read traces and/or voice coil motor (VCM) traces, the fine actuator traces may be positioned not-adjacent to read traces, such as between write traces adjacent the read traces and serial input/output (SIO) traces adjacent VCM traces, and/or at least five trace-widths away from the VCM traces.

20 Claims, 9 Drawing Sheets

(56)     References Cited

U.S. PATENT DOCUMENTS

| | | | | |
|---|---|---|---|---|
| 2005/0180053 A1* | 8/2005 | Dovek | G11B 5/486 |
| | | | 360/246 |
| 2012/0140360 A1* | 6/2012 | Contreras | G11B 5/486 |
| 2015/0015990 A1 | 1/2015 | Chou et al. | |
| 2022/0036923 A1* | 2/2022 | Koizumi | G11B 5/1278 |
| 2022/0418092 A1* | 12/2022 | Kishimoto | H05K 1/0298 |
| 2023/0062571 A1* | 3/2023 | Tokuda | H05K 1/189 |
| 2023/0127221 A1* | 4/2023 | Koizumi | G11B 21/02 |
| | | | 360/246 |
| 2023/0276566 A1* | 8/2023 | Nakamiya | H05K 1/115 |
| | | | 361/679.33 |

* cited by examiner

READ-WRITE HEAD 210

208b

208a

208c

208

FOLD AREA

208e

208d

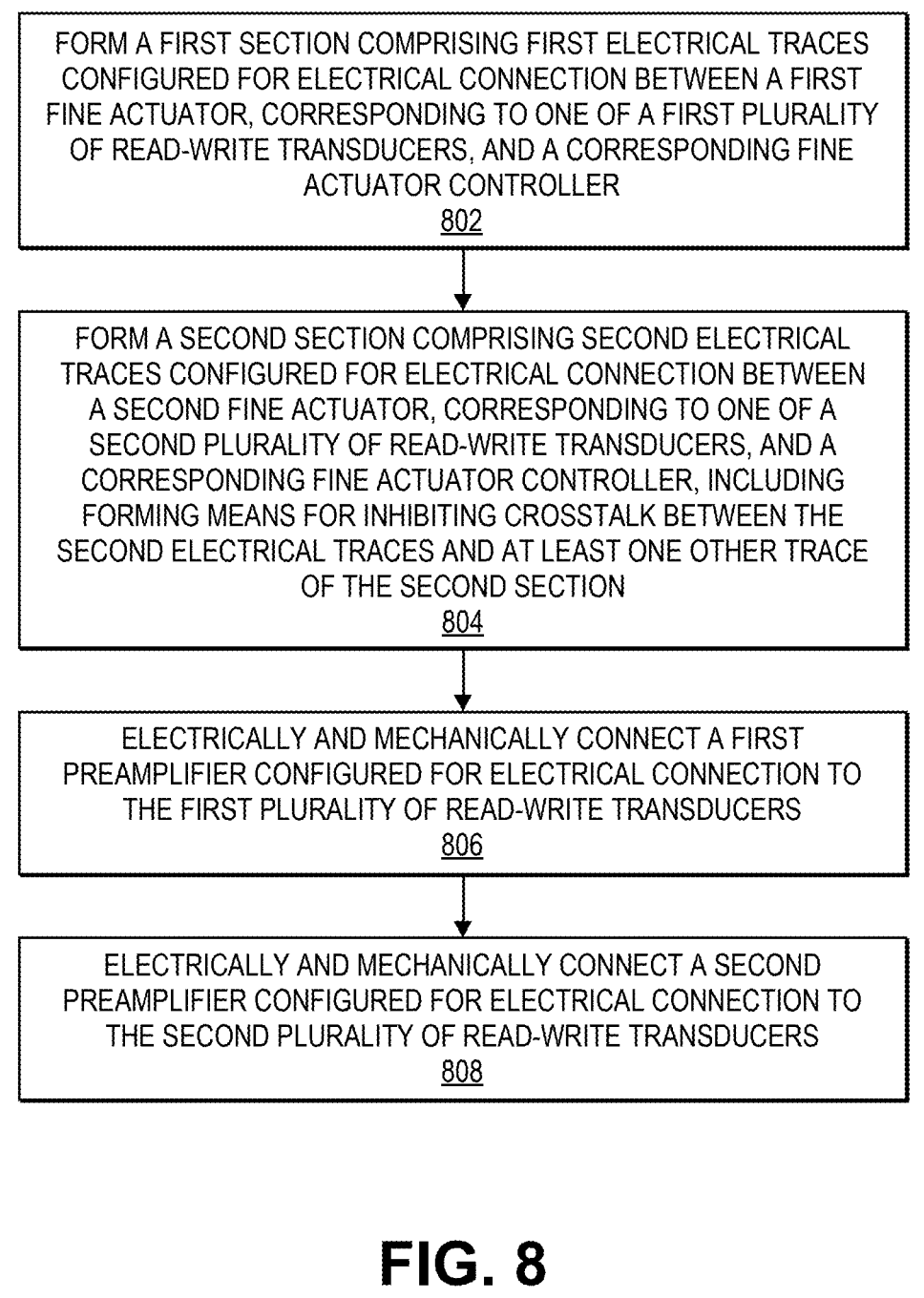

FORM A FIRST SECTION COMPRISING FIRST ELECTRICAL TRACES CONFIGURED FOR ELECTRICAL CONNECTION BETWEEN A FIRST FINE ACTUATOR, CORRESPONDING TO ONE OF A FIRST PLURALITY OF READ-WRITE TRANSDUCERS, AND A CORRESPONDING FINE ACTUATOR CONTROLLER
802

FORM A SECOND SECTION COMPRISING SECOND ELECTRICAL TRACES CONFIGURED FOR ELECTRICAL CONNECTION BETWEEN A SECOND FINE ACTUATOR, CORRESPONDING TO ONE OF A SECOND PLURALITY OF READ-WRITE TRANSDUCERS, AND A CORRESPONDING FINE ACTUATOR CONTROLLER, INCLUDING FORMING MEANS FOR INHIBITING CROSSTALK BETWEEN THE SECOND ELECTRICAL TRACES AND AT LEAST ONE OTHER TRACE OF THE SECOND SECTION
804

ELECTRICALLY AND MECHANICALLY CONNECT A FIRST PREAMPLIFIER CONFIGURED FOR ELECTRICAL CONNECTION TO THE FIRST PLURALITY OF READ-WRITE TRANSDUCERS
806

ELECTRICALLY AND MECHANICALLY CONNECT A SECOND PREAMPLIFIER CONFIGURED FOR ELECTRICAL CONNECTION TO THE SECOND PLURALITY OF READ-WRITE TRANSDUCERS
808

FIG. 8

FLEXIBLE PRINTED CIRCUIT FINGER TRACE LAYOUT FOR PARALLEL SERVO OPERATION

FIELD OF EMBODIMENTS

Embodiments of the invention may relate generally to hard disk drives, and particularly to approaches to a flexible printed circuit for parallel servo operation.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head (or "transducer") that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

To write data to the medium, or to read data from the medium, the head has to receive instructions from a controller. Hence, the head is connected to the controller in some electrical manner so that not only does the head receive instructions to read/write data, but the head can also send information back to the controller regarding the data read and/or written. Typically, a flexible printed circuit (FPC) is used to electrically transmit signals from the read-write head via a suspension tail to other electronics within an HDD. The FPC and the suspension tail are typically soldered together at a comb or "E-block" portion (see, e.g., carriage 134 of FIG. 1) of a head-stack assembly (HSA). Unwanted transfer of signals between communication channels, referred to as "crosstalk", is a well-known electronics phenomenon and is usually caused by undesired capacitance, inductive, or conductive coupling from one channel to another. In an HDD, crosstalk "noise" can occur between microactuator traces and other vulnerable traces, such as read signal traces for example. With crosstalk, the flow of data to/from the head may be compromised.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 8 is a flow diagram illustrating a method of manufacturing a flexible printed circuit, according to an embodiment.

DETAILED DESCRIPTION

Generally, approaches to avoiding crosstalk noise among flexible printed circuit electrical traces for parallel servo operation in a hard disk drive (HDD), are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

Introduction

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment or to every embodiment.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the structure is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

At a distal end of the suspension, there is a read-write transducer (or "head") to read and write data. At the other proximal end of the suspension, there are electrically conductive pads (or simply "electrical pads" or "pads") to electrically connect to corresponding electrically conductive pads on a flexible printed circuit (FPC). The suspension pads and the FPC pads are typically electrically interconnected with solder or an ACF (anisotropic conductive film).

Figure 1:
FIG. 1 is a plan view illustrating a hard disk drive, according to an embodiment.
Figure 2A:
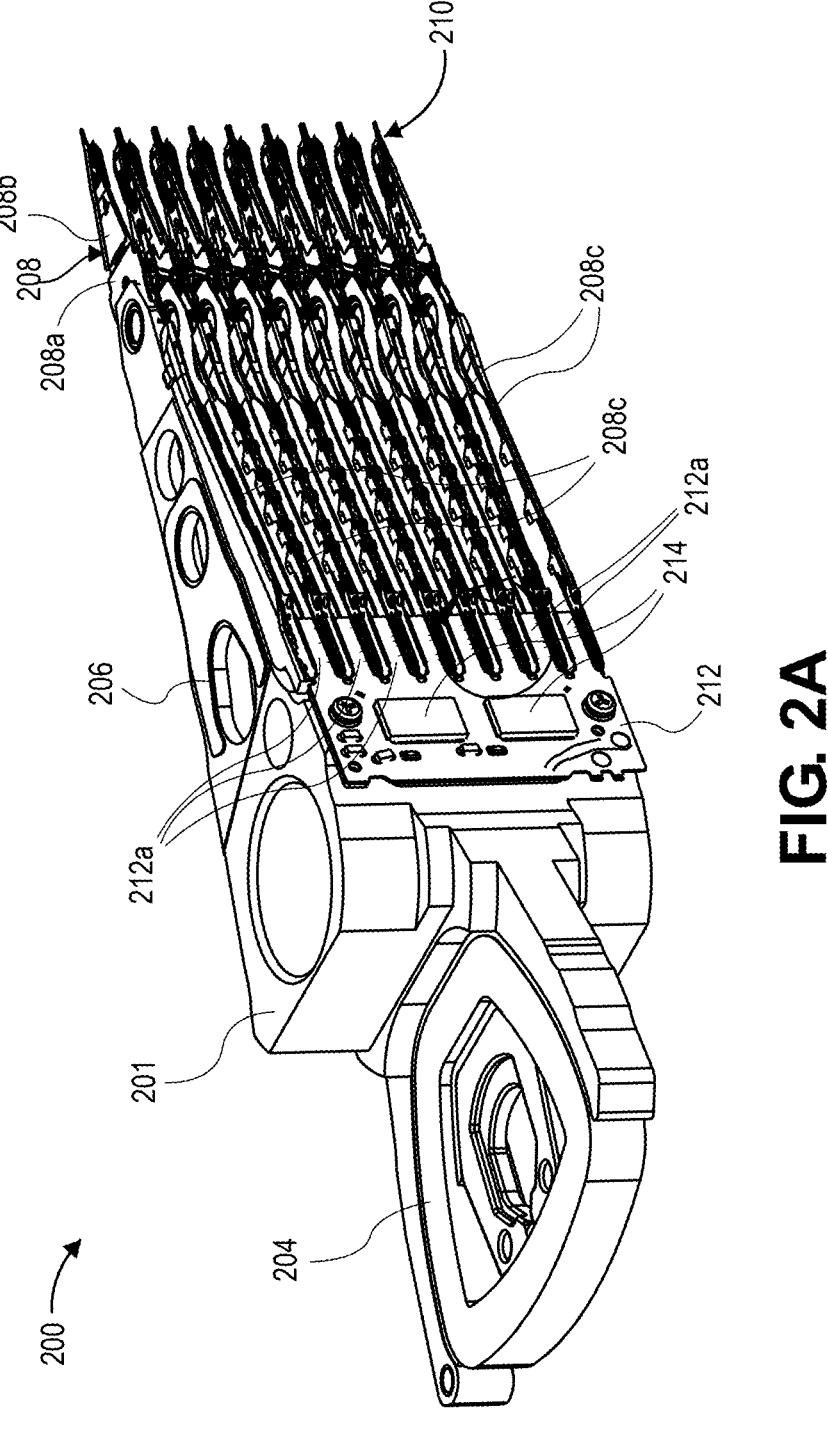
FIG. 2A is a perspective view illustrating an actuator assembly, according to an embodiment.

FIG. 2A is a perspective view illustrating an actuator assembly, according to an embodiment. Actuator assembly 200 comprises a carriage 201 (see, e.g., carriage 134 of FIG. 1) rotatably coupled with a central pivot shaft (not shown here; see, e.g., pivot shaft 148 of FIG. 1) by way of a pivot bearing assembly (not shown here; see, e.g., pivot bearing assembly 152 of FIG. 1), and rotationally driven by a voice coil motor (VCM), of which a voice coil 204 is illustrated here. Actuator assembly 200 further comprises one or more actuator arm 206 (see, e.g., arm 132 of FIG. 1), to each of which is coupled a suspension assembly 208 (see, e.g., lead suspension 110c of FIG. 1) housing a read-write head 210 (see, e.g., read-write head 110a of FIG. 1), and typically comprising a swaged baseplate 208a, a load beam 208b (see, e.g., load beam 110d of FIG. 1), and a suspension tail 208c (only some of which are labeled here). Each suspension assembly 208 is electrically connected with a flexible printed circuit (FPC) 212 coupled with the carriage 201, by way of suspension tail 208c. As such, the electrical conductors, leads, wires, traces on each suspension assembly 208 lead to the FPC 212 which comprises one or more FPC finger(s) 212a (only some of which are labeled here, to maintain illustrative clarity) with which each suspension tail 208c is electrically and mechanically coupled, e.g., via solder pads. Each FPC finger 212a typically services both an UP head (a read-write head facing upwards to service a bottom surface of a corresponding disk) and a DN head (a read-write head facing downwards to service a top surface of a corresponding disk), electrically connecting each corresponding UP suspension and DN suspension to a preamp 214 (or beyond) mounted on the FPC 212. Each preamp 214 is typically electrically connected to one or more controller, e.g., a "system on a chip" ("SOC") for transmission of signals therebetween.

Figure 2B:
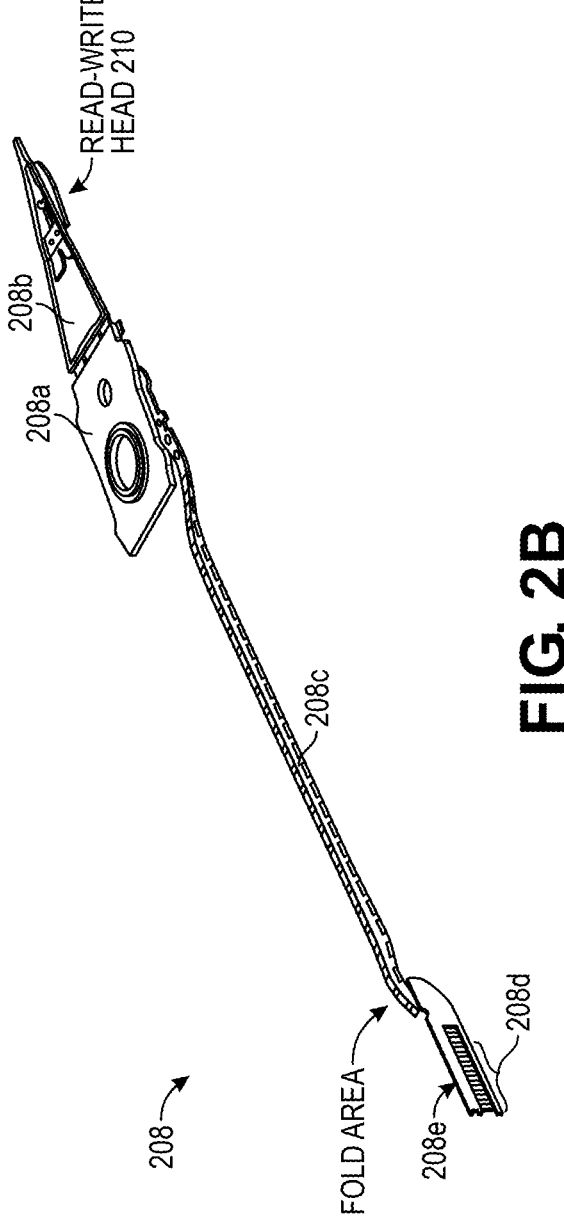
FIG. 2B is a perspective view illustrating an integrated lead suspension (ILS) of the actuator assembly of FIG. 2A, according to an embodiment.

FIG. 2B is a perspective view illustrating an integrated lead suspension (ILS) of the actuator assembly of FIG. 2A, according to an embodiment. Suspension 208 comprises the baseplate 208a (e.g., swaged to a corresponding actuator arm 206 in the actuator assembly 200 of FIG. 2A) connected to the load beam 208b, to which the read-write head 210 is attached at a distal end. Electrical signals are carried from the head and possibly other electronic components (such as a microactuator, for a non-limiting example) at the distal end to the FPC 212 (FIG. 2A) to the proximal end, by way of electrical leads integral to the suspension tail 208c. The suspension tail 208c may have a fold at a fold area, beyond which in the proximal direction are located multiple electrical pads 208d on a suspension tail tip 208e. These electrical pads 208d are electrically connected to the FPC 212, in the actuator assembly 200, such as with solder or an ACF.

Recall that unwanted crosstalk can occur between signals routed relatively closely together. For non-limiting examples, such crosstalk may occur between microactuator traces, which may be routed outside of any preamp (e.g., preamp 214 of FIG. 2A), and other traces such as read signal traces and/or VCM signals. For example, a microactuator (or "secondary actuator" or "fine actuator") wired outside of a preamp may contribute to oscillation risks, such as based on crosstalk signal that could loop back to the preamp read input. For another example, crosstalk may occur from VCM signals to microactuator traces based at least in part because of the relatively large slew rate of the VCM. Thus, in view of the foregoing likelihood of unwanted crosstalk between certain signals/traces, according to an embodiment the risk of crosstalk is minimized by way of judicious routing of certain traces that may be the source of such crosstalk.

Increasing areal density (a measure of the quantity of information bits that can be stored on a given area of disk surface) is one of the on-going goals of hard disk drive technology evolution. However, in recent years the growth in areal density in HDDs has not kept pace with the trends of years past, and this has to some extent shifted the burden on to the mechanics to boost capacity increases by increasing the number of disks within the prescribed form factor. In one form, this goal manifests in the type of high-capacity HDDs that are especially attractive in the context of enterprise, cloud computing/storage, and data center environments. However, the performance of high-capacity HDDs has not necessarily scaled up commensurately with the increases in capacity. The high latencies of large capacity HDDs in a clustered environment, such as in data centers with multiple clustered nodes, may limit their appeal due to slower access to stored data. As these HDDs are primarily used for near line storage in data centers in hyper-scale environments, the performance of these high-capacity drives also has to satisfy the IOPs (Input/Output Operations Per Second) density requirements (in some instances, similarly referred to as IOPs/TB) to minimize latency. This has led to the need to develop and implement various means to increase high-capacity HDD performance. One approach to increasing high-capacity HDD performance is the implementation of multi-actuator systems, in which multiple independently operating actuators are assembled onto a single shared pivot shaft in order to independently and concurrently read from and/or write to multiple recording disks of a disk stack. With a dual-actuator system for example, each actuator system typically operates in conjunction with a respective preamp and likely a separate (or integrated) servo controller, operating according to an operational paradigm referred to herein as "parallel servo operation".

Additionally, increasing areal density has led to the necessary development and implementation of secondary and even tertiary actuators (generally, "fine-actuators") for improved head positioning through relatively fine positioning, in addition to a primary voice coil motor (e.g., VCM) actuator which provides relatively coarse positioning. Some HDDs employ micro- or milli-actuator designs to provide second and/or third stage actuation of the recording head to enable more accurate positioning of the head relative to the recording tracks. Milli-actuators may be broadly classified as actuators that move the entire front end of the suspension: e.g., load beam, flexure and slider, and are typically used as second stage actuators. Micro-actuators (or "microactuators") may be broadly classified as actuators that move (e.g., rotate) only the slider, moving it relative to the suspension and load beam, or move only the read-write element relative to the slider body. A microactuator may be used solely in conjunction with a first stage actuator (e.g., VCM), or in conjunction with a first stage actuator and a second stage actuator (e.g., milli-actuator) for more accurate head positioning. The terms "microactuator", "milli-actuator", "secondary actuator", "tertiary actuator", "dual stage actuator", "fine-actuator" and the like, if used herein, refer generally to a relatively fine-positioning actuator (e.g., technically, either secondary or tertiary) used in conjunction with a primary relatively coarse-positioning actuator, such as a VCM actuator in the context of an HDD. Piezoelectric (PZT) based and capacitive micro-machined transducers are two types of fine-actuators that have been developed for use with HDD sliders.

In a known multi-actuator (or "split actuator") system, each fine actuator(s) for each of the multiple actuators is driven separately via a respective FPC. That is, in the case of a dual-actuator system the fine actuator signal traces for the top actuator are routed via a corresponding top FPC and, similarly, the fine actuator signal traces for the bottom actuator are routed via a corresponding bottom FPC. In both cases, the fine actuator traces are routed outside of any preamp and thus physically/positionally outside of corresponding ground traces and VCM traces to avoid or inhibit crosstalk from fine actuator signals.

Figures 3A, 3B:
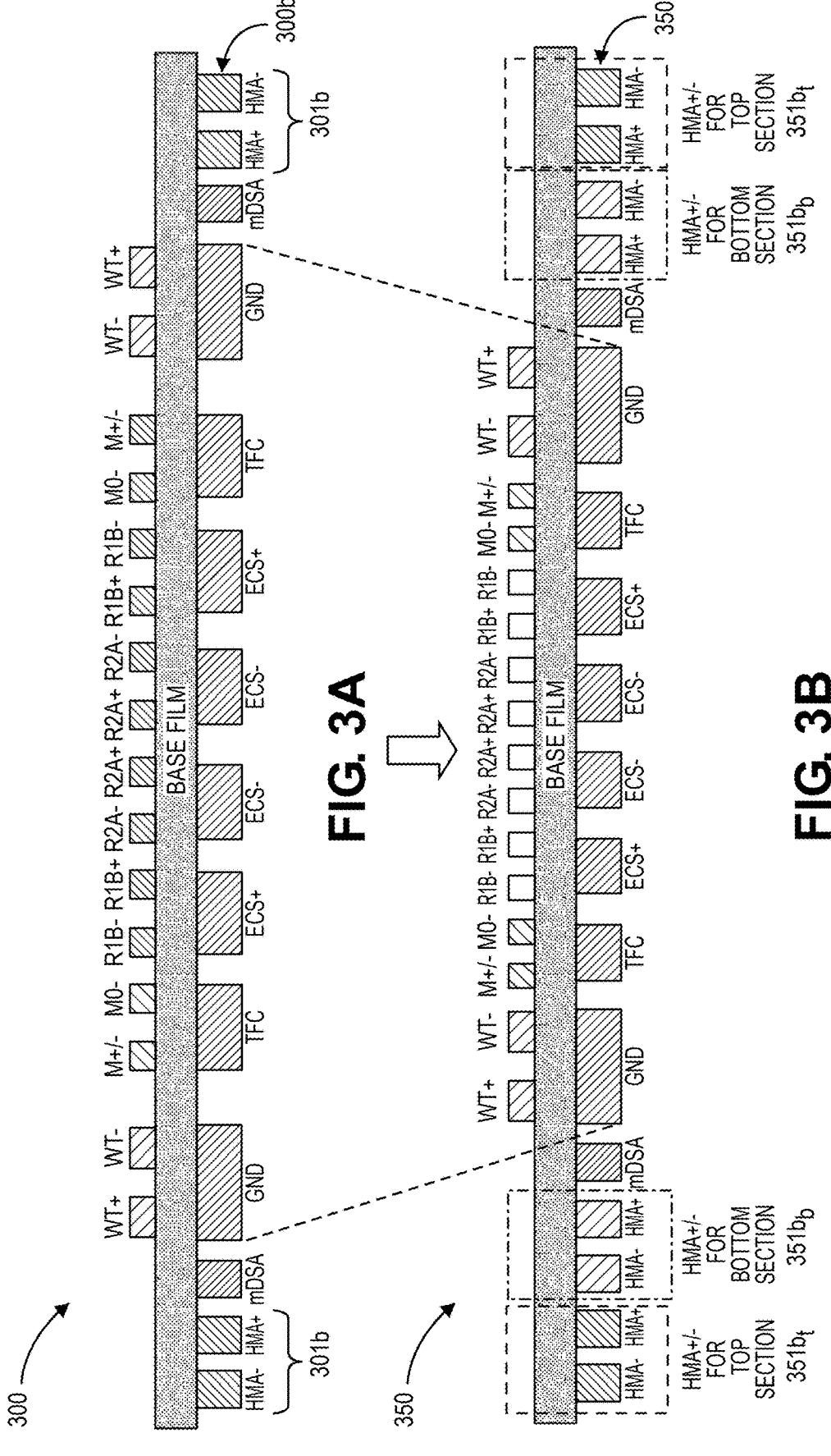
FIG. 3A is a cross-section diagram illustrating an example flexible printed circuit (FPC) trace layout for single servo operation, according to an embodiment.
FIG. 3B is a cross-section diagram illustrating an example FPC trace layout for parallel servo operation, according to an embodiment.

By extension, it may be that single-actuator HDDs may employ parallel servo operation to enhance performance, whereby the fine actuators of each servo system are driven separately by "top" (e.g., preamp #1 heads)/"bottom" (e.g., preamp #0 heads) systems, whereby each servo system fine actuator trace pairs may be routed on either a top section or a bottom section of a single FPC. FIG. 3A is a cross-section diagram illustrating an example flexible printed circuit (FPC) trace layout for single servo operation, according to an embodiment. Trace layout 300 comprises a plurality of electrical traces, corresponding to a single servo system, and as illustrated and labeled throughout FIG. 3A. Trace layout 300 may include more layers than as shown and thus may vary from implementation to implementation, where only the pertinent layers are shown here for simplicity and clarity. Here, the cross-sectional view shows that each of the two pairs of microactuator traces 301b (referred to here as HMA− and HMA+) of the UP and DN heads are routed on one wiring layer 300b (e.g., one side) of the FPC, generally next to or near the GND (ground) trace. FIG. 3B is a cross-section diagram illustrating an example FPC trace layout for parallel servo operation, according to an embodiment. Trace layout 350 comprises a plurality of electrical traces, corresponding to a parallel (dual) servo system, and as illustrated and labeled throughout FIG. 3B. Here, the cross-sectional view shows that each of the four pairs of microactuator traces 351bt (top section of parallel servo system FPC), 351bb (bottom section of parallel servo system FPC) (each referred to here as HMA− and HMA+) of the UP and DN heads are routed on one wiring layer 350b of the FPC, generally next to or near the GND (ground) trace. As depicted in the case of FIG. 3B, trace routing for parallel servo operation increases the trace number in the FPC finger 212a area (see, e.g., FIG. 2A) by two trace pairs to accommodate each of the microactuator servo traces. Consequently, a finer trace width and/or spacing may be needed. This could lead to the need for a newer, more costly, and longer time-to-development manufacturing process. Based on the foregoing, one can see that a different approach to routing fine actuator traces in the context of parallel servo operation, single-FPC may be desirable.

Flexible Printed Circuit for Parallel Servo Operation

Parallel servo operation in the context of a single actuator HDD is designed to perform simultaneous read and write operations in conjunction with two separate preamps (top and bottom) (see, e.g., preamps 214 of FIG. 2A). One approach in the context of routing microactuator traces for parallel servo operation of a single FPC, according to an embodiment, is to route one pair of microactuator traces for one preamp side or section of a single FPC (e.g., top section) separately from the other pair of microactuator traces for the other preamp side or section of the single FPC (e.g., bottom section).

Figures 4A, 4B:
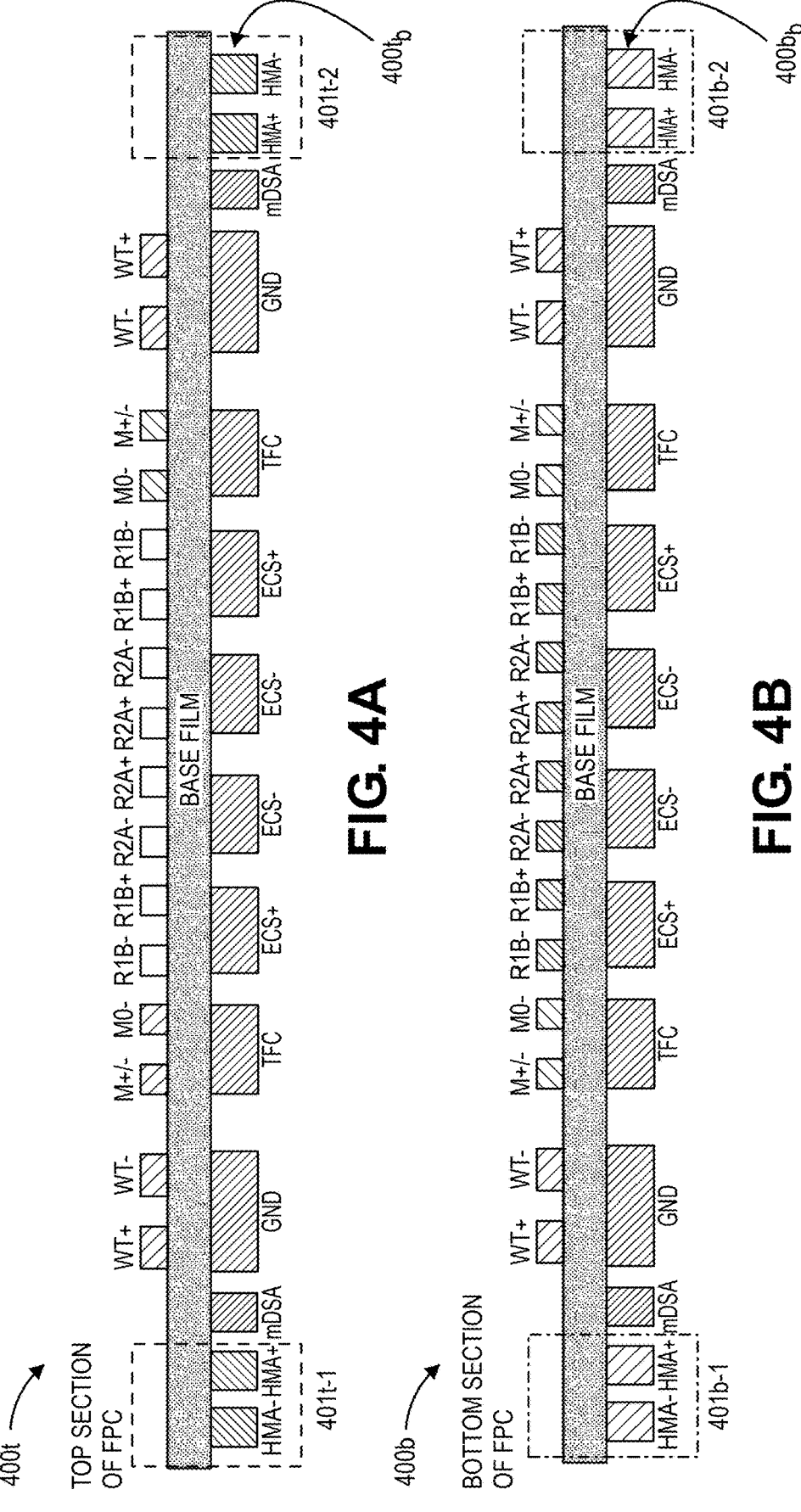
FIG. 4A is a cross-section diagram illustrating a FPC trace layout for a top section portion for parallel servo operation, according to an embodiment.
FIG. 4B is a cross-section diagram illustrating a FPC trace layout for a bottom section portion for parallel servo operation, according to an embodiment.

FIG. 4A is a cross-section diagram illustrating a FPC trace layout for a top section portion for parallel servo operation, and FIG. 4B is a cross-section diagram illustrating a FPC trace layout for a bottom section portion for parallel servo operation, according to an embodiment. Top section trace layout 400t of FIG. 4A comprises a plurality of electrical traces, corresponding to a parallel (dual) servo system, and as illustrated and labeled throughout FIG. 4A. Here, the cross-sectional view depicts two pairs of microactuator traces 401t-1, 401t-2 (e.g., for top section of parallel servo system FPC; each referenced here as HMA− and HMA+) for the UP and DN heads, respectively, for a given FPC finger (see, e.g., FPC finger 212a of FIG. 2A) and associated with or corresponding to a top preamp (see, e.g., top preamp 214 of FIG. 2A), routed on one wiring layer 400tb of the FPC, generally next to or near the GND (ground) trace. Similarly, bottom section trace layout 400b of FIG. 4B comprises a plurality of electrical traces, corresponding to a parallel (dual) servo system, and as illustrated and labeled throughout FIG. 4B. Here, the cross-sectional view depicts two pairs of microactuator traces 401b-1, 401b-2 (e.g., for bottom section of parallel servo system FPC; each referenced here as HMA− and HMA+) for the UP and DN heads, respectively, for a given FPC finger and associated with or corresponding to a bottom preamp (see, e.g., bottom preamp 214 of FIG. 2A), routed on one wiring layer 400bb of the FPC, generally next to or near the GND (ground) trace. Thus, the cross-section for a given FPC finger of the top (first) section trace layout 400t electrically connecting a first plurality of read-write transducers to the first preamplifier (see preamp 514t of FIG. 5) and/or a first fine actuator controller (in the case of fine actuator traces) is configured the same as (i.e., relative positioning of the traces) the cross-section for a given FPC finger of the bottom (second) section trace layout 400b electrically connecting a second plurality of read-write transducers to the second preamplifier (see preamp 514b of FIG. 5) and/or a second fine actuator controller.

Such a "split FPC" (or sectioned) configuration can forego the need for a newer, more costly, and longer time-to-development manufacturing process, such as illustrated and described in reference to FIGS. 3A-3B. However, the risk of crosstalk from the microactuator traces to the read and/or VCM traces (e.g., regarding oscillation) in each FPC area from each preamp to the controller SOC remains a concern, even with this top section/bottom section FPC configuration. As increasing FPC size to increase the distance between the relevant traces is challenging and not necessarily viable within other HDD design and configuration constraints, judicious routing of such traces can allay such concerns.

Figure 5:
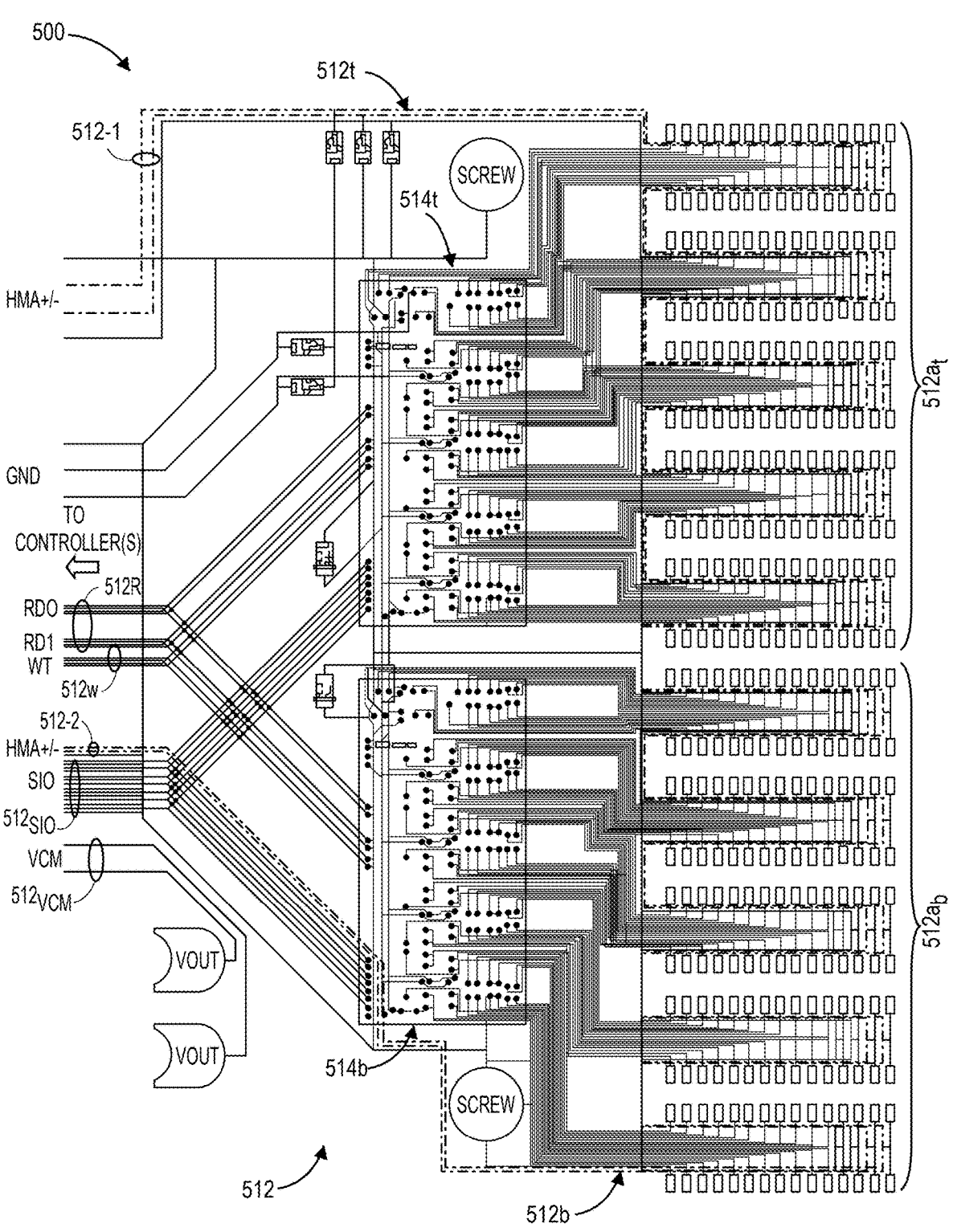
FIG. 5 is a diagram illustrating FPC trace layout for parallel servo operation, according to an embodiment.

FIG. 5 is a diagram illustrating FPC trace layout for parallel servo operation, according to an embodiment. Trace layout 500 represents an FPC trace layout or configuration for an FPC 512 having FPC fingers (see, e.g., FPC fingers 212$a$ of FPC 212 of FIG. 2A), here comprising FPC fingers 512$a_t$ for a top section 512$t$ of FPC 512 and FPC fingers 512$a_b$ for a bottom section 512$b$ of FPC 512. The number of FPC fingers 512$a_t$, 512$a_b$ per each section 512$t$, 512$b$ may vary from implementation to implementation, based on how many recording disks and corresponding read-write transducers/heads there are in a given HDD. Five FPC fingers 512$a_t$, 512$a_b$ for each of the top and bottom sections 512$t$, 512$b$ are shown here simply for purposes of a non-limiting example. A cross-section of each FPC finger 512$a_t$ may be characterized by trace layout 400$t$ of FIG. 4A and a cross-section of each FPC finger 512$a_b$ may be characterized by trace layout 400$b$ of FIG. 4B. Trace layout 500 further comprises a top preamp 514$t$ (see, e.g., preamps 214 of FPC 212 of FIG. 2A) associated with or corresponding to top section 512$t$ and a bottom preamp 514$b$ associated with or corresponding to top section 512$b$.

According to an embodiment, top (first) section 512$t$ of FPC 512 comprises first electrical traces 512-1 (e.g., two pairs of traces such as 401$t$-1, 401$t$-2 (HMA− and HMA+) of FIG. 4A) between first fine actuator(s) (UP and DN, as described elsewhere herein) each corresponding to one of a first plurality of read-write transducers (see, e.g., magnetic read-write head 110$a$ of FIG. 1) electrically coupled with top preamp 514$t$, and a corresponding fine actuator controller. An electronic controller in this context typically includes circuitry such as one or more processors for executing instructions, and may be implemented as a System on a Chip (SoC) electronic circuitry, which may include a memory, a microcontroller, a Digital Signal Processor (DSP), an ASIC, a Field Programmable Gate Array (FPGA), hard-wired logic, analog circuitry and/or a combination thereof, for non-limiting examples. Here, one or more fine actuator controller may be implemented as a part of a main controller SOC, or may be a separate electronic component, which may vary from implementation to implementation. Bottom (second) section 512$b$ of FPC 512 comprises second electrical traces 512-2 (e.g., two pairs of traces such as 401$b$-1, 401$b$-2 (HMA− and HMA+) of FIG. 4B) between first fine actuator(s) (UP and DN, as described elsewhere herein) corresponding to one of a second plurality of read-write transducers (see, e.g., magnetic read-write head 110$a$ of FIG. 1) electrically coupled with bottom preamp 514$b$, and a corresponding fine actuator controller, e.g., the same as or different from the fine actuator controller associated with the top section 512$t$.

According to an embodiment, in an area electrically connecting the second preamplifier 514$b$ with a main controller, the second electrical traces 512-2 are positioned anti-adjacent (i.e., not adjacent) to a read trace 512R. Thus, potential crosstalk between the fine actuator second electrical traces 512-2 and the read traces 512R is thereby avoided or inhibited.

According to an embodiment, in the FPC area electrically connecting the second preamplifier 514$b$ to the main controller, the second electrical traces 512-2 are positioned with a write trace 512$w$ between them and the read trace 512R. Here too, potential crosstalk between the fine actuator second electrical traces 512-2 and the read traces 512R is thereby avoided or inhibited.

According to an embodiment, in the FPC area electrically connecting the second preamplifier 514$b$ to the main controller, the second electrical traces 512-2 are positioned with at least one (likely a grouping) serial input/output (SIO) trace 512$_{SIO}$ between the second electrical traces 512-2 and a voice coil motor (VCM) trace 512$_{VCM}$. Combining the previous two embodiments, according to an embodiment, the second electrical traces 512-2 are positioned between a write trace 512$_W$ and at least one (likely a grouping) serial input/output (SIO) trace 512$_{SIO}$. Here, potential crosstalk impact between the fine actuator second electrical traces 512-2 and the read traces 512R is minimized by separating these traces with a write trace 512$_W$ therebetween, while potential crosstalk impact between the fine actuator second electrical traces 512-2 and the VCM traces 512$_{VCM}$ is also minimized by separating these traces with SIO traces 512$_{SIO}$ therebetween.

According to an embodiment, in the area electrically connecting the second preamplifier 514$b$ to the main controller, the second electrical traces 512-2 are positioned at least five trace-widths ("5 W") away from the voice coil motor trace 512$_{VCM}$. Thus, while preferably the second electrical traces 512-2 are positioned anti-adjacent to voice coil motor trace 512$_{VCM}$, it may be acceptable to position these traces adjacently in the context of potential crosstalk as long as there is sufficient space (i.e., 5 W) therebetween.

Furthermore, in the description of fine actuators elsewhere herein, milli-actuators are broadly classified as actuators that move the entire front end of the suspension whereas microactuators are broadly classified as actuators that move (e.g., rotate) only the slider or only the read-write element relative to the slider body, and that these types of fine actuators may be implemented in conjunction with one another. Thus, crosstalk between milli-actuator traces, which are also typically routed outside of any preamp, and other traces may be of similar concern as microactuator-based crosstalk.

Figures 6A, 6B:
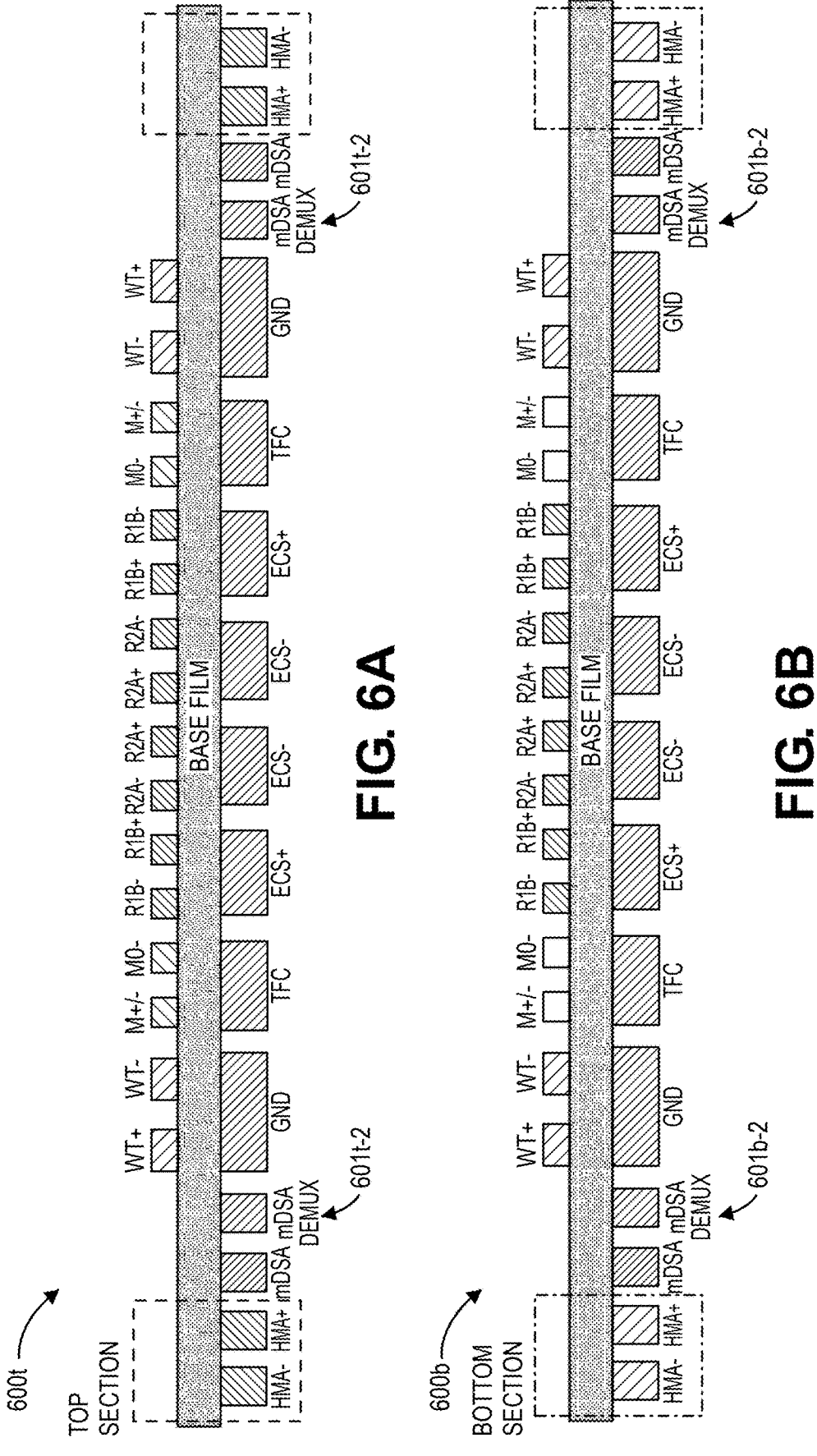
FIG. 6A is a cross-section diagram illustrating a FPC trace layout for a top section portion for parallel servo operation with a milli-actuator demultiplexer, according to an embodiment.
FIG. 6B is a cross-section diagram illustrating a FPC trace layout for a bottom section portion for parallel servo operation with a milli-actuator demultiplexer, according to an embodiment.

FIG. 6A is a cross-section diagram illustrating a FPC trace layout for a top section portion for parallel servo operation with a milli-actuator demultiplexer, and FIG. 6B is a cross-section diagram illustrating a FPC trace layout for a bottom section portion for parallel servo operation with a milli-actuator demultiplexer, both according to an embodiment. Similar to the trace layouts 400$t$, 400$b$ of FIGS. 4A-4B, a top section trace layout 600$t$ of FIG. 6A comprises a plurality of electrical traces, corresponding to a parallel (dual) servo system, and as illustrated and labeled throughout FIG. 6A. Here, the cross-sectional view depicts the two pairs of microactuator traces labeled as HMA− and HMA+ for the UP and DN heads as previously discussed, for a given FPC finger (see, e.g., FPC finger 212$a$ of FIG. 2A) and associated with or corresponding to a top preamp (see, e.g., top preamp 214 of FIG. 2A, top preamp 514$t$ of FIG. 5), and which are routed on a single wiring layer of the FPC generally next to or near the GND (ground) trace. Similarly, bottom section trace layout 600$b$ of FIG. 6B comprises a plurality of electrical traces, corresponding to a parallel (dual) servo system, and as illustrated and labeled throughout FIG. 6B. Here also the cross-sectional view depicts two pairs of microactuator traces labeled as HMA− and HMA+ for the UP and DN heads as previously discussed for a given FPC finger and associated with or corresponding to a bottom preamp (see, e.g., bottom preamp 214 of FIG. 2A, bottom preamp 514$b$ of FIG. 5), which are also routed on a single wiring layer of the FPC generally next to or near the GND (ground) trace.

Additionally and according to an embodiment in which a microactuator demultiplexer (i.e., a "demux" circuit that has one input and more than one output) is employed, each trace layout 600t, 600b is provisioned with additional traces 601t-2, 601b-2, respectively, for the microactuator demultiplexers. Here also the cross-section for a given FPC finger of the top (first) section trace layout 600t electrically connecting the first plurality of read-write transducers to the top preamplifier and/or a first fine actuator controller (in the case of fine actuator traces) is configured the same as (i.e., relative positioning of the traces) the cross-section for a given FPC finger of the bottom (second) section trace layout 600b electrically connecting the second plurality of read-write transducers to the second preamplifier and/or the second fine actuator controller. However, the risk of cross-talk from the milli-actuator traces to the read and/or VCM traces (e.g., regarding oscillation) in each FPC area from each preamp to the controller SOC may remain a concern, even with this top section/bottom section FPC configuration.

Figure 7:
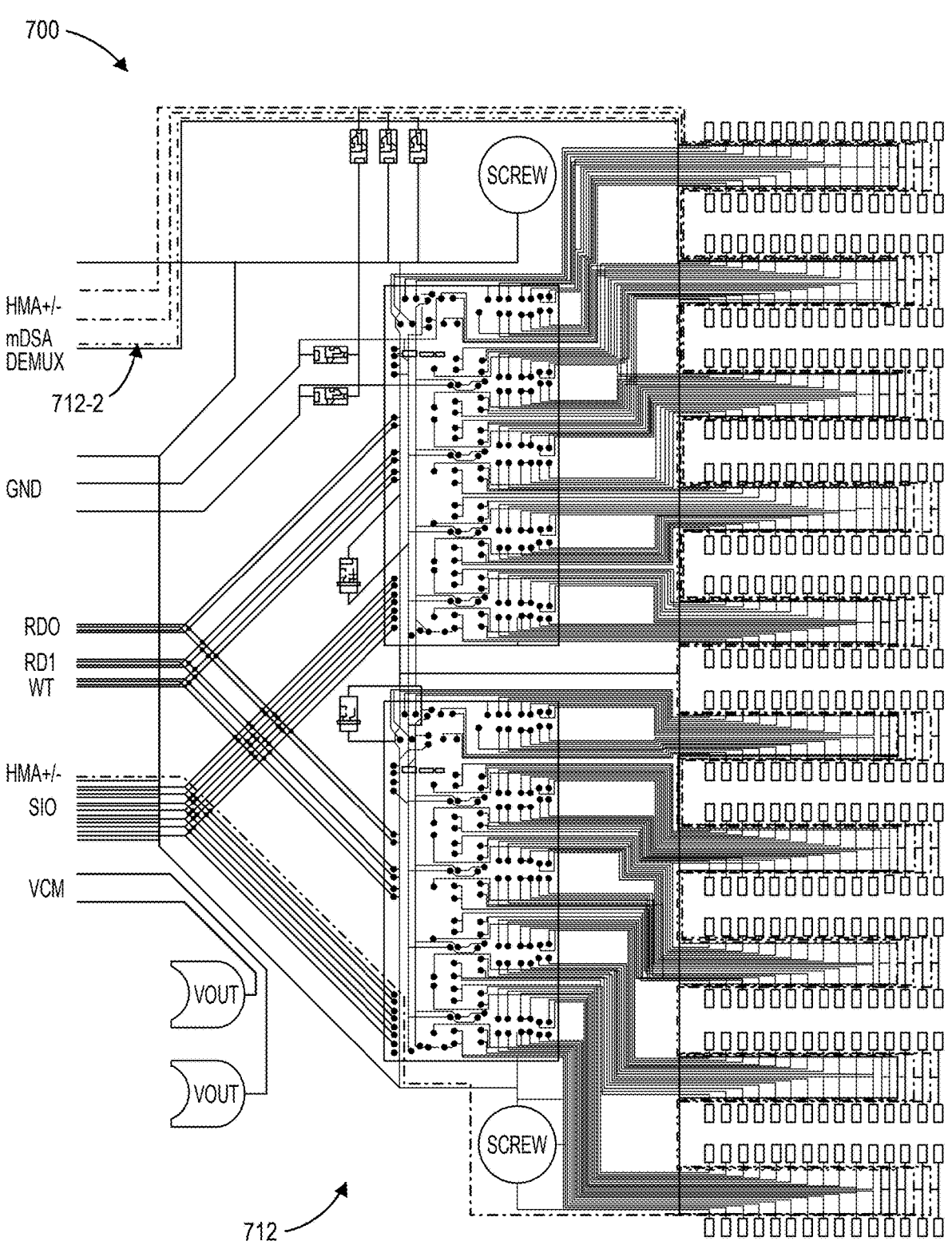
FIG. 7 is a diagram illustrating FPC trace layout for parallel servo operation with a milli-actuator demultiplexer, according to an embodiment.

FIG. 7 is a diagram illustrating FPC trace layout for parallel servo operation with a milli-actuator demultiplexer. Trace layout 700 represents an FPC trace layout or configuration for an FPC 712 having FPC fingers (see, e.g., FPC fingers 212a of FPC 212 of FIG. 2A), where the number of FPC fingers for each top and bottom section may vary from implementation to implementation based on how many recording disks and corresponding read-write transducers/heads there are in a given HDD. A cross-section of each top section FPC finger may be characterized by trace layout 600t of FIG. 6A and a cross-section of each bottom section FPC finger may be characterized by trace layout 600b of FIG. 6B. The components of FPC trace layout 700 are the same as or similar to the components of FPC trace layout 500 of FIG. 5, with the addition of the milli-actuator demux traces 712-2 which, in an area electrically connecting the top preamplifier with the main controller, the milli-actuator traces 712-2 are positioned outside of a ground trace. This trace configuration can also forego the need for a newer, more costly, and longer time-to-development manufacturing process, such as illustrated and described in reference to FIGS. 3A-3B, even in view of the need for the additional milli-actuator traces 712-2. Furthermore, the risk of crosstalk from the milli-actuator traces 712-2 to the read and/or VCM traces (e.g., regarding oscillation) in each FPC area from each preamp to the controller SOC may also be allayed by way of judicious routing of such traces.

Method of Manufacturing a Flexible Printed Circuit

FIG. 8 is a flow diagram illustrating a method of manufacturing a flexible printed circuit, according to an embodiment. For example, the method of FIG. 8 may be used to manufacture an FPC such as FPC 512 (FIG. 5) and/or FPC 712 (FIG. 7).

At block 802, form a first section comprising first electrical traces configured for electrical connection between a first fine actuator, corresponding to one of a first plurality of read-write transducers, and a corresponding fine actuator controller. For example, top section 512t (FIG. 5), comprising first electrical traces 512-1 configured for electrical connection between first fine actuator(s) corresponding to one or more of a first plurality of read-write transducers, such as those associated with top preamp 514t, and a corresponding fine actuator controller are formed.

At block 804, form a second section comprising second electrical traces configured for electrical connection between a second fine actuator, corresponding to one of a second plurality of read-write transducers, and a corresponding fine actuator controller. For example, bottom section 512b (FIG. 5), comprising second electrical traces 512-2 configured for electrical connection between second fine actuator(s) corresponding to one or more of a second plurality of read-write transducers, such as those associated with bottom preamp 514b, and a corresponding fine actuator controller are formed. According to an embodiment, forming bottom section 512b includes forming means for inhibiting crosstalk between the second electrical traces and at least one other trace of the bottom section 512b.

For example and according to an embodiment, in an area electrically connecting the second preamplifier 514b with a main controller, the second electrical traces 512-2 are positioned anti-adjacent (i.e., not adjacent) to a read trace 512R. For example and according to an embodiment, in the FPC area electrically connecting the second preamplifier 514b to the main controller, the second electrical traces 512-2 are positioned with a write trace 512w between them and the read trace 512R. For example and according to an embodiment, in the FPC area electrically connecting the second preamplifier 514b to the main controller, the second electrical traces 512-2 are positioned with at least one (likely a grouping) serial input/output (SIO) trace $512_{SIO}$ between the second electrical traces 512-2 and a voice coil motor (VCM) trace $512_{VCM}$. For example and according to an embodiment, the second electrical traces 512-2 are positioned between a write trace 512w and at least one (likely a grouping) serial input/output (SIO) trace $512_{SIO}$. For example and according to an embodiment, in the area electrically connecting the second preamplifier 514b to the main controller, the second electrical traces 512-2 are positioned at least five trace-widths ("5 W") away from the voice coil motor trace $512_{VCM}$.

At block 806, electrically and mechanically connect a first preamplifier configured for electrical connection to the first plurality of read-write transducers. For example, top preamp 514t is electrically and mechanically connected to the first plurality of read-write transducers.

At block 808, electrically and mechanically connect a second preamplifier configured for electrical connection to the second plurality of read-write transducers. For example, bottom preamp 514b is electrically and mechanically connected to the second plurality of read-write transducers.

With manufacturing a FPC according to the method of FIG. 8, potential crosstalk between fine actuator traces and read traces and/or VCM traces is minimized by routing such traces according to the foregoing embodiments.

Physical Description of an Illustrative Operating Context

Embodiments may be used in the context of a digital data storage device (DSD) such as a hard disk drive (HDD). Thus, in accordance with an embodiment, a plan view illustrating a conventional HDD 100 is shown in FIG. 1 to aid in describing how a conventional HDD typically operates.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110*a*, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110*a*, are transmitted by a flexible cable assembly (FCA) 156 (or "flex cable", or "flexible printed circuit" (FPC)). Interconnection between the flex cable 156 and the head 110*a* may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110*a* of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110*b* rides so that the slider 110*b* flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110*b* rides.

The electrical signal provided to the voice coil 140 of the VCM enables the head 110*a* of the HGA 110 to access a track 176 on which information is recorded. Thus, the armature 136 of the VCM swings through an arc 180, which enables the head 110*a* of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110*a* of the HGA 110 reads the servo-burst-signal pattern, which provides a position-error-signal (PES) to the servo electronics, which controls the electrical signal provided to the voice coil 140 of the VCM, thereby enabling the head 110*a* to follow the track 176. Upon finding the track 176 and identifying a particular sectored track portion 188, the head 110*a* either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

EXTENSIONS AND ALTERNATIVES

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A hard disk drive (HDD) comprising:
a plurality of recording disk media rotatably mounted on a spindle;
a plurality of head sliders each housing a respective read-write transducer configured to read from and to write to at least one recording medium of the plurality of recording disk media;
a carriage, with which a voice coil is coupled; and
a flexible printed circuit (FPC) coupled to the carriage, and to which is electrically coupled a first preamplifier electrically connected to a first plurality of the read-write transducers and a second preamplifier electrically connected to a second plurality of the read-write transducers, the FPC comprising:
a first section comprising first electrical traces between a first fine actuator, corresponding to one of the first plurality of read-write transducers, and a corresponding first fine actuator controller, and
a second section comprising second electrical traces between a second fine actuator, corresponding to one of the second plurality of read-write transducers, and a corresponding second fine actuator controller,
wherein in an area electrically connecting the second preamplifier with a main controller, the second electrical traces are positioned with a write trace between the second electrical traces and a read trace.

2. The HDD of claim 1, wherein in the FPC area electrically connecting the second preamplifier with the main controller, the second electrical traces are positioned with a group of serial input/output (SIO) traces between the second electrical traces and a voice coil motor trace.

3. The HDD of claim 2, wherein in an FPC area electrically connecting the first preamplifier with the main controller, the first electrical traces and a-milli-fine actuator trace are positioned outside of a ground trace.

4. The HDD of claim 3, wherein in the FPC area electrically connecting the second preamplifier with the main controller, the second electrical traces are positioned at least five trace-widths away from a voice coil motor trace.

5. The HDD of claim 1, wherein in the FPC area electrically connecting the second preamplifier with the main controller, the second electrical traces are positioned at least five trace-widths away from a voice coil motor trace.

6. The HDD of claim 1, wherein:
a first layout of electrical traces, of the first section, electrically connecting the first plurality of read-write transducers to the first preamplifier and/or the first fine actuator controller is the same as a second layout of electrical traces, of the second section, electrically connecting the second plurality of read-write transducers to the second preamplifier and/or the second fine actuator controller.

7. The HDD of claim 1, wherein the FPC is a singular FPC coupled to a singular carriage with which a singular corresponding voice coil is coupled.

8. A flexible printed circuit (FPC) for a hard disk drive, the FPC comprising:
a first preamplifier electrically connected to a first plurality of read-write transducers;
a second preamplifier electrically connected to a second plurality of read-write transducers;
a first section comprising first electrical traces between a first fine actuator, corresponding to one of the first plurality of read-write transducers, and a corresponding first fine actuator controller; and
a second section comprising second electrical traces between a second fine actuator, corresponding to one of the second plurality of read-write transducers, and a corresponding second fine actuator controller;
wherein in an area electrically connecting the second preamplifier with a main controller, the second electrical traces are positioned anti-adjacent to a with a write trace between the second electrical traces and a read trace.

9. The FPC of claim 8, wherein in the FPC area electrically connecting the second preamplifier with the main controller, the second electrical traces are positioned with a group of serial input/output (SIO) traces between the second electrical traces and a voice coil motor trace.

10. The FPC of claim 9, wherein in the FPC area electrically connecting the second preamplifier with the main controller, the second electrical traces are positioned at least five trace-widths away from the voice coil motor trace.

11. The FPC of claim 8, wherein in the FPC area electrically connecting the second preamplifier with the main controller, the second electrical traces are positioned at least five trace-widths away from a voice coil motor trace.

12. A hard disk drive comprising the FPC of claim 8.

13. The FPC of claim 8, wherein in an FPC area electrically connecting the first preamplifier with the main controller, the first electrical traces and a first fine actuator trace are positioned outside of a ground trace.

14. The FPC of claim 8, wherein:
a first layout of electrical traces, of the first section, electrically connecting the first plurality of read-write transducers to the first preamplifier and/or the first fine actuator controller is the same as a second layout of electrical traces, of the second section, electrically connecting the second plurality of read-write transducers to the second preamplifier and/or the second fine actuator controller.

15. A method of manufacturing a flexible printed circuit (FPC), the method comprising:
forming a first section comprising first electrical traces configured for electrical connection between a first fine actuator, corresponding to one of a first plurality of read-write transducers, and a corresponding first fine actuator controller;

forming a second section comprising second electrical traces configured for electrical connection between a second fine actuator, corresponding to one of a second plurality of read-write transducers, and a corresponding second fine actuator controller;

electrically and mechanically connecting a first preamplifier configured for electrical connection to the first plurality of read-write transducers; and electrically and mechanically connecting a second preamplifier configured for electrical connection to the second plurality of read-write transducers;

wherein forming the second section includes forming means for inhibiting crosstalk between the second electrical traces and at least one other trace of the second section, including forming the second electrical traces, in an area of traces configured for electrical connection of the second preamplifier with a main controller, positioned with a write trace between the second electrical traces and a read trace.

16. The method of claim 15, wherein forming the means for inhibiting crosstalk further includes forming the second electrical traces, in the area of traces configured for electrical connection of the second preamplifier with the main controller, positioned with a group of serial input/output (SIO) traces between the second electrical traces and a voice coil motor trace.

17. The method of claim 16, wherein forming the means for inhibiting crosstalk further includes forming the second electrical traces, in the area of traces configured for electrical connection of the second preamplifier with the main controller, positioned at least five trace-widths away from the voice coil motor trace.

18. The method of claim 15, wherein forming the means for inhibiting crosstalk further includes forming the second electrical traces, in the area of traces configured for electrical connection of the second preamplifier with the main controller, positioned at least five trace-widths away from a voice coil motor trace.

19. The method of claim 15, wherein forming the first section includes forming, in an area electrically connecting the first preamplifier with the main controller, the first electrical traces and a fine actuator trace positioned outside of a ground trace.

20. The method of claim 15, wherein forming the first section includes forming a first layout of electrical traces, of the first section, electrically connecting the first plurality of read-write transducers to the first preamplifier and/or the first fine actuator controller the same as a second layout of electrical traces, of the second section, electrically connecting the second plurality of read-write transducers to the second preamplifier and/or the second fine actuator controller.

* * * * *